United States Patent
Li et al.

(10) Patent No.: US 11,394,305 B2
(45) Date of Patent: Jul. 19, 2022

(54) POWER CONVERTER

(71) Applicant: Silergy Semiconductor Technology (Hangzhou) LTD, Hangzhou (CN)

(72) Inventors: Jian Li, Hangzhou (CN); Wei Chen, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 17/148,779

(22) Filed: Jan. 14, 2021

(65) Prior Publication Data

US 2021/0226545 A1 Jul. 22, 2021

(30) Foreign Application Priority Data

Jan. 22, 2020 (CN) .......................... 202010075564.7

(51) Int. Cl.
*H02M 3/335* (2006.01)
*H05B 45/382* (2020.01)
*H02M 1/00* (2006.01)
*G01R 19/165* (2006.01)

(52) U.S. Cl.
CPC ... *H02M 3/33576* (2013.01); *H02M 3/33561* (2013.01); *H05B 45/382* (2020.01); *G01R 19/16538* (2013.01); *H02M 1/0009* (2021.05); *H02M 1/0025* (2021.05)

(58) Field of Classification Search
CPC ......... H02M 3/33576; H02M 3/33561; H02M 1/0009; H02M 1/0025; H05B 45/382; G01R 19/16538
See application file for complete search history.

(56) References Cited

U.S. PATENT DOCUMENTS

| | | | |
|---|---|---|---|
| 7,227,277 B2 | 6/2007 | Chapman et al. | |
| 7,256,568 B2 | 8/2007 | Lam et al. | |
| 8,310,846 B2 | 11/2012 | Piazzesi | |
| 8,853,888 B2 | 10/2014 | Khaligh | |
| 9,130,460 B2 | 9/2015 | Sun et al. | |
| 9,257,916 B2 | 2/2016 | Cheng et al. | |
| 9,543,822 B2 | 1/2017 | Hang et al. | |
| 9,559,591 B2 | 1/2017 | Hang et al. | |
| 2007/0052397 A1 | 3/2007 | Thompson et al. | |
| 2008/0231115 A1 | 9/2008 | Cho et al. | |
| 2008/0258688 A1 | 10/2008 | Hussain et al. | |
| 2012/0104956 A1* | 5/2012 | Yang | H05B 45/347 315/201 |
| 2012/0153729 A1 | 6/2012 | Song et al. | |

(Continued)

*Primary Examiner* — Jue Zhang

(57) ABSTRACT

A power converter can include an input circuit having a primary winding and a primary power switch coupled in series between an input terminal and the ground; a first output circuit having a first secondary winding which is coupled with the primary winding; a second output circuit having a second secondary winding coupled with the primary winding and at least one secondary power switch; a first control circuit that controls the primary power switch to be turned on and off to adjust an output signal of the first output circuit; and a second control circuit which controls the secondary power switch to be turned on and off to adjust an output signal of the second output circuit. The secondary power switch can be turned on before the primary power switch is turned off in a first state in one switching cycle, in order to reduce the switching interference.

19 Claims, 11 Drawing Sheets

(56) References Cited

U.S. PATENT DOCUMENTS

| | | |
|---|---|---|
| 2013/0063180 A1 | 3/2013 | Sun et al. |
| 2015/0078045 A1 | 3/2015 | Zhang et al. |
| 2016/0211745 A1 | 7/2016 | Hang et al. |
| 2017/0063238 A1 | 3/2017 | Hang et al. |
| 2017/0079099 A1* | 3/2017 | Wu .................. H05B 45/382 |
| 2017/0279279 A1 | 9/2017 | Shimada et al. |
| 2018/0198361 A1 | 7/2018 | Seong et al. |

* cited by examiner

POWER CONVERTER

RELATED APPLICATIONS

This application claims the benefit of Chinese Patent Application No. 202010075564.7, filed on Jan. 22, 2020, which is incorporated herein by reference in its entirety.

FIELD OF THE INVENTION

The present invention generally relates to the field of power electronics, and more particularly to power converters.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. Switching power supplies have a wide variety of applications in modern electronics. For example, switching power supplies can be used to drive light-emitting diode (LED) loads.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
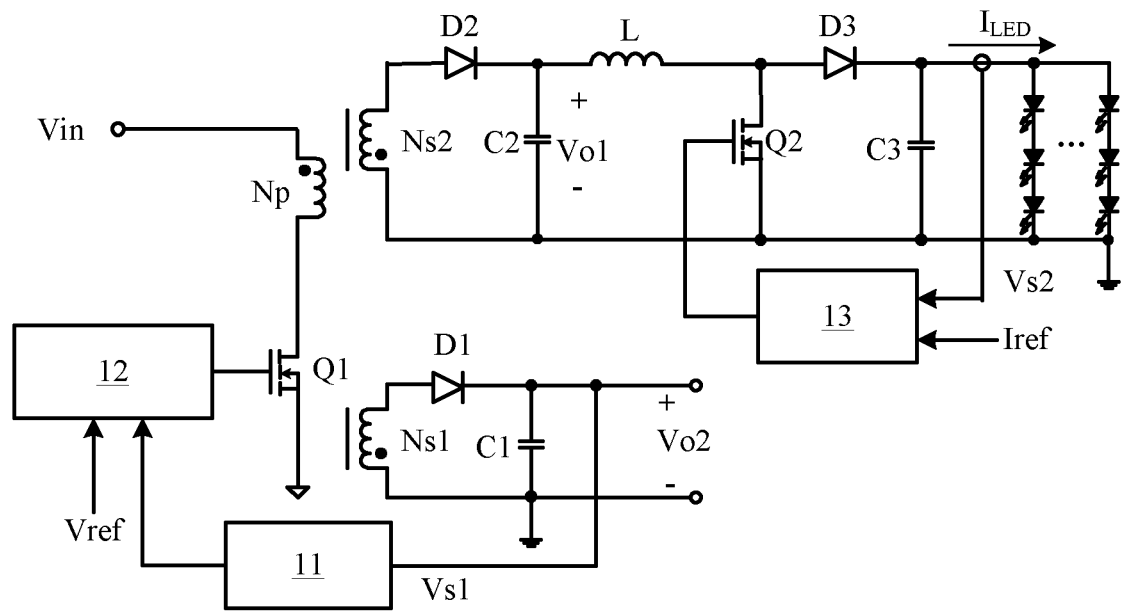
FIG. 1 is a schematic block diagram of an example power converter having multiple output terminals including a constant voltage output port and a constant current output port.

Referring now to FIG. 1, shown is a schematic block diagram of an example power converter having multiple output terminals, including a constant voltage output port and a constant current output port. In this example, power converter 1 may provide multiple output ports by utilizing a plurality of secondary windings of a transformer. Each secondary winding can be connected to an output circuit. In a constant current output circuit, secondary winding Ns2 can be coupled to primary winding Np. Primary power switch Q1 can connect in series with the primary winding and is controlled to be turned on and off, so that a square wave voltage is generated between two ends of secondary winding Ns2. Diode D2 and capacitor C2 may perform a function of a rectifier circuit that rectifies and filters the square wave voltage and provides a relatively constant output voltage Vo1. Inductor L, power switch Q2, diode D3, and capacitor C3 may perform a function of a boost-type power converter, which can connect between the rectifier circuit and an LED.

The boost-type power converter can be controlled by constant current control circuit 13 to convert output voltage Vo1 into constant output current $I_{LED}$, and may supply constant output current $I_{LED}$ to the LED load. Constant current control circuit 13 can generate a control signal in accordance with current sampling signal Vs2 and current reference signal Iref. In the constant voltage output circuit, secondary winding Ns1 can be coupled to primary winding Np. Diode D1 and capacitor C1 may perform a function of a rectifier circuit that rectifies and filters a voltage generated between two ends of secondary winding Ns1 and provides constant output voltage Vo2. Voltage sampling signal Vs1 representing output voltage Vo2 can be transferred to the primary side of the power converter by optocoupler circuit 11. Constant voltage control circuit 12 can control on and off states of primary power switch Q1 in accordance with voltage sampling signal Vs1 and reference voltage Vref so that output voltage Vo2 maintains constant. Thus, this example power converter can provide a constant current output and a constant voltage output by two-stage power stage circuit. However, the two-stage power conversion in the constant current output circuit can increase conversion loss and decrease conversion efficiency. Moreover, the two-stage power circuit needs two magnetic components, which increases a size of the system.

In particular embodiments, a power converter can include an input circuit having a primary winding and a primary power switch coupled in series between an input terminal and the ground; at least one first output circuit having a first secondary winding coupled with the primary winding; at least one second output circuit having a second secondary winding which is coupled with the primary winding and at least one secondary power switch; a first control circuit that controls the primary power switch to be turned on and off to adjust an output signal of the first output circuit; and a second control circuit which controls the secondary power switch to be turned on and off to adjust an output signal of the second output circuit. The secondary power switch can be turned on before the primary power switch is turned off in a first state in one switching cycle, in order to reduce the switching interference.

For example, the secondary power switch can be turned on when the primary power switch is turned on in the first state. Further, the second control circuit can control the secondary power switch to be turned on during the on time of the primary power switch in the first state. In the first state, the switching cycle of the primary power switch may be the same as that of the secondary power switch. The second control circuit can control the secondary power switch to be turned on for at least a portion of a period during which the primary power switch is turned off, such that the output signal of the second output circuit is maintained as constant. In the first state, the power converter may operate on the continuous conduction mode (CCM) or discontinuous conduction mode (DCM), etc.

Figure 2A:
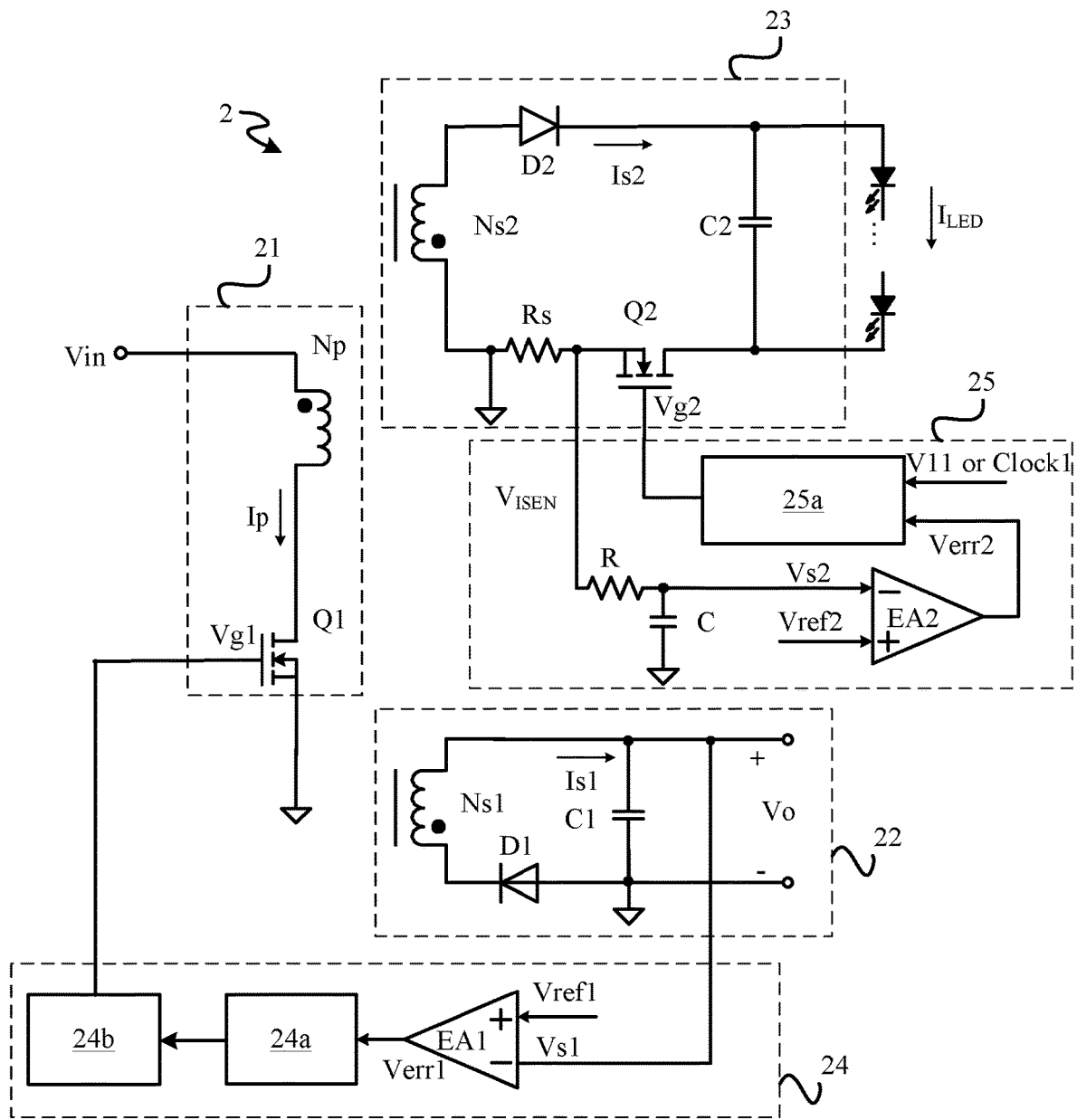
FIG. 2A is a schematic block diagram of a first example power converter, in accordance with embodiments of the present invention.

Referring now to FIG. 2A, shown is a schematic block diagram of a first example power converter in accordance with embodiments of the present invention. In this particular example, power converter 2 can include input circuit 21, at least one output circuit 22, at least one output circuit 23, and control circuits 24 and 25. Input circuit 21 can include primary winding Np and primary power switch Q1. Primary winding Np and primary power switch Q1 can connect in series between an input terminal of power converter 2 and the ground. Input voltage Vin at the input terminal may be obtained from an AC voltage after being rectified by a rectifier bridge and then filtered by an input capacitor.

In this example, output circuit 22 is a constant voltage output circuit, and output circuit 23 is a constant current output circuit. Output circuit 22 may have secondary winding Ns1 coupled with primary winding Np. Output circuit 23 may have secondary winding Ns2 coupled with primary winding Np. Primary winding Np, secondary winding Ns1, and secondary winding Ns2 may form a transformer. Further, output circuit 23 can include secondary power switch Q2 that can be turned on before primary power switch Q1 is turned off in a first state in one switching cycle, in order to reduce the switching interference. For example, the secondary power switch can be turned on when the primary power switch is turned on in the first state. Further, the second control circuit can control the secondary power switch to be turned on during the on time of the primary power switch in the first state.

When secondary power switch Q2 is turned on and primary power switch Q1 is turned off, output circuit 23 may at least partially be conducted. In this example, output circuit 23 is completely conducted in this case. When secondary power switch Q2 is turned off and primary power switch Q1 is turned off, output circuit 23 may at least partially be disabled (e.g., out of operation). In this example, output circuit 23 is completely disabled in such case. In particular embodiments, secondary winding Ns1 and secondary winding Ns2 can be determined such that a reflecting voltage from an output voltage of secondary winding Ns2 to secondary winding Ns1 is less than an output voltage of secondary winding Ns1 when secondary power switch Q2 is turned on. Therefore, output circuit 22 may be disabled by a rectifier device (e.g., diode D1 in the rectifier circuit) when primary power switch Q1 is turned off and secondary power switch Q2 is turned on. That is, a freewheeling current flowing through the first output circuit can be zero, or near zero.

This control method can be achieved by adjusting a turns ratio of secondary winding Ns1 and secondary winding Ns2, or the like. Due to an effect of electromagnetic induction, a voltage between two terminals of secondary winding Ns1 and a voltage between two terminals of secondary winding Ns2 can increase when primary power switch Q1 is turned off. Since the reflecting voltage from the output voltage of secondary winding Ns2 to secondary winding Ns1 is less than the output voltage of secondary winding Ns1 when constant current output circuit 23 is conducted (e.g., primary power switch Q1 is turned off and secondary power switch Q2 is turned on), diode D2 can be turned on and the freewheeling current may begin to flow in output circuit 23 when a voltage across secondary winding Ns2 reaches its output voltage.

In addition, the reflecting voltage may not reach its output voltage such that diode D1 is turned off, and output circuit 22 can be disabled. Because energy accumulated in the magnetic component is released by secondary winding Ns2, no freewheeling current may flow through first secondary windings Ns1. Thus, the energy accumulated in primary winding Np can be released through a circuit that is connected to secondary winding Ns2 (e.g., output circuit 23). In addition, the freewheeling current flowing through output circuit 22 can be zero, or nearly zero. When secondary power switch Q2 is turned off, primary winding Np may release energy through output circuit 22, and the freewheeling current may flow through output circuit 22. In this way, the freewheeling current may flow through the constant current output circuit and the constant voltage output circuit in a time sharing manner by controlling secondary power switch Q2 to be turned on and off. In addition, the secondary power switch can be turned on before the primary power switch is turned off in a first state in one switching cycle, in order to reduce the switching interference.

For example, output circuit 22 is a constant voltage output circuit, and includes secondary winding Ns1, a voltage output port, and a first rectifier circuit. The first rectifier circuit can be coupled between the voltage output port and secondary winding Ns1, and may include diode D1 and capacitor C1. In addition, control circuit 24 can control primary power switch Q1 to be turned on and off so as to adjust an output signal (e.g., output voltage Vo) of output circuit 22. For example, control circuit 24 may obtain voltage sampling signal Vs1 by sampling output voltage Vo, and may generate error compensation signal Verr1 in accordance with voltage reference signal Vref1 representing a desired output voltage of output circuit 22 and voltage sampling signal Vs1. Control circuit 24 may also generate control signal Vg1 in accordance with error compensation signal Verr1 to control the on and off state of primary power switch Q1, in order to maintain output voltage Vo as constant.

Optionally, control circuit 24 can include error amplifier circuit EA1, optocoupler circuit 24a, and control signal generation circuit 24b. For example, error amplifier circuit EA1 may generate error compensation signal Verr1 in accordance with voltage sampling signal Vs1 and voltage reference signal Vref1. Optocoupler circuit 24a can transfer error compensation signal Verr1 from the secondary side to the primary side of the power converter (e.g., to the control signal generation circuit 24b) in an optocoupler manner. Control signal generation circuit 24b may generate control signal Vg1 in accordance with error compensation signal Verr1 to control the on and off states of primary power switch Q1.

One skilled in the art will recognize that any control circuit that can control the primary power switch in accordance with the output voltage to maintain the output voltage as constant may be utilized in certain embodiments. Output circuit 23 may be a constant current output circuit, and can include secondary winding Ns2, a current output port, a second rectifier circuit, current sampling circuit Rs, and secondary power switch Q2. The second rectifier circuit can be coupled between the current output port and secondary winding Ns2. For example, the second rectifier circuit can include diode D2 and capacitor C2.

Current sampling circuit Rs and secondary power switch Q2 can connect in series in the constant current output circuit (e.g., connected in series with secondary winding Ns2). In this example, current sampling circuit Rs is a sampling resistor connected between the ground and a first terminal of secondary power switch Q2, and a second terminal of secondary power switch Q2 can connect with one terminal of the current output port. For example, the constant current output circuit can connect to an LED load connected to the current output port. In addition, the LED load can be integrated with the full power converter. It should be understood that the current sampling circuit can be connected to other portions of the constant current output circuit. For example, current sampling signal $V_{ISEN}$ that represents the current flowing through the second output circuit can be obtained by detecting a voltage across the sampling resistor.

Figure 2B:
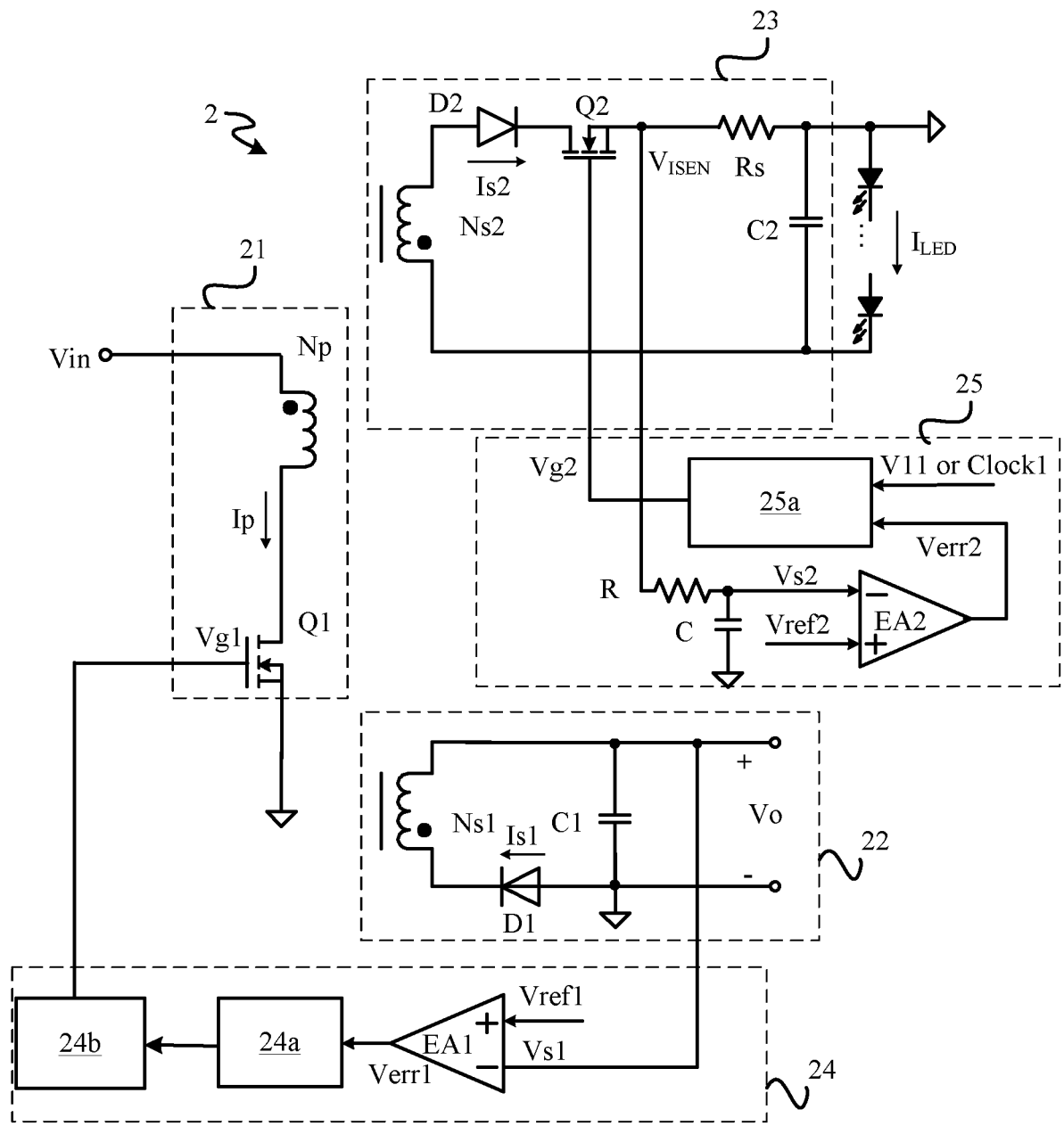
FIG. 2B is a schematic block diagram of a second example power converter, in accordance with embodiments of the present invention.

Referring now to FIG. 2B, shown is a schematic block diagram of a second example power converter, in accordance with embodiments of the present invention. In this example, current sampling resistor Rs can connect between the first terminal of secondary power switch Q2 and the ground, the second terminal of secondary power switch Q2 may be coupled to one terminal of secondary winding Ns2. Moreover, the constant current output circuit can connect to an LED load connected with the current output port. To facilitate sampling the voltage on the LED load, the anode of the LED load may be grounded in order to determine whether the LED load is shorted or opened. The cathode of the LED load can be grounded by changing the position of current sampling circuit Rs and secondary power switch Q2, in order to facilitate sampling the voltage on the LED load.

Control circuit 25 can average current sampling signal $V_{ISEN}$ sampled by current sampling circuit Rsto to obtain average sampling signal Vs2 that represents an average current flowing through the LED load. Control circuit 25 may generate control signal Vg2 in accordance with average sampling signal Vs2, current reference signal Vref2 representing a desired output current of output circuit 23, and inner clock signal Clock1 or sampling signal V11, in order to control the on and off states of secondary power switch Q2. In this way, an average value of the output current of output circuit 23 can be maintained as constant, where sampling signal V11 represents the voltage across secondary winding Ns1 or secondary winding Ns2.

For example, control circuit 25 can control the turn-off moment of secondary power switch Q2 according to current sampling signal $V_{ISEN}$ and current reference signal Vref2. Control circuit 25 can control the turn-on moment of secondary power switch Q2 according to sampling signal V11 or inner clock signal Clock1, where sampling signal V11 represents the voltage across secondary winding Ns1 or secondary winding Ns2. For example, control circuit 25 can control secondary power switch Q2 to be turned on and off so that the freewheeling current flows through output circuit 22 and output circuit 23 in a time sharing manner when primary power switch Q1 is turned off thereby providing multiple constant current/voltage outputs. In addition, a time duration during which the freewheeling current flows through output circuit 23 may be adjusted to control its output current.

Control circuit 25 can include an averaging circuit, error amplifier circuit EA2, and control signal generation circuit 25a. For example, the averaging circuit can include resistor R and capacitor C. That is, the averaging circuit is an RC circuit for averaging current sampling signal $V_{ISEN}$. The average sampling signal Vs2 can be obtained by averaging current sampling signal $V_{ISEN}$. Further, error amplifier circuit EA2 may generate error compensation signal Verr2 in accordance with average sampling signal Vs2 and current reference signal Vref2. Further, control signal generation circuit 25a may generate control signal Vg2 in accordance with error compensation signal Verr2 and sampling signal V11 or inner clock signal Clock1, in order to control the on and off states of secondary power switch Q2, where sampling signal V11 represents the voltage across secondary winding Ns1 or secondary winding Ns2. One skilled in the art will recognize that any control circuit that can control the secondary power switch in accordance with the output current to maintain the output current constant is applicable in the embodiment. Further, the desired output current can be adjusted by adjusting current reference signal Vref2 according to a dimming signal when performing LED load dimming to realize the adjustment of the output current.

Figure 2C:
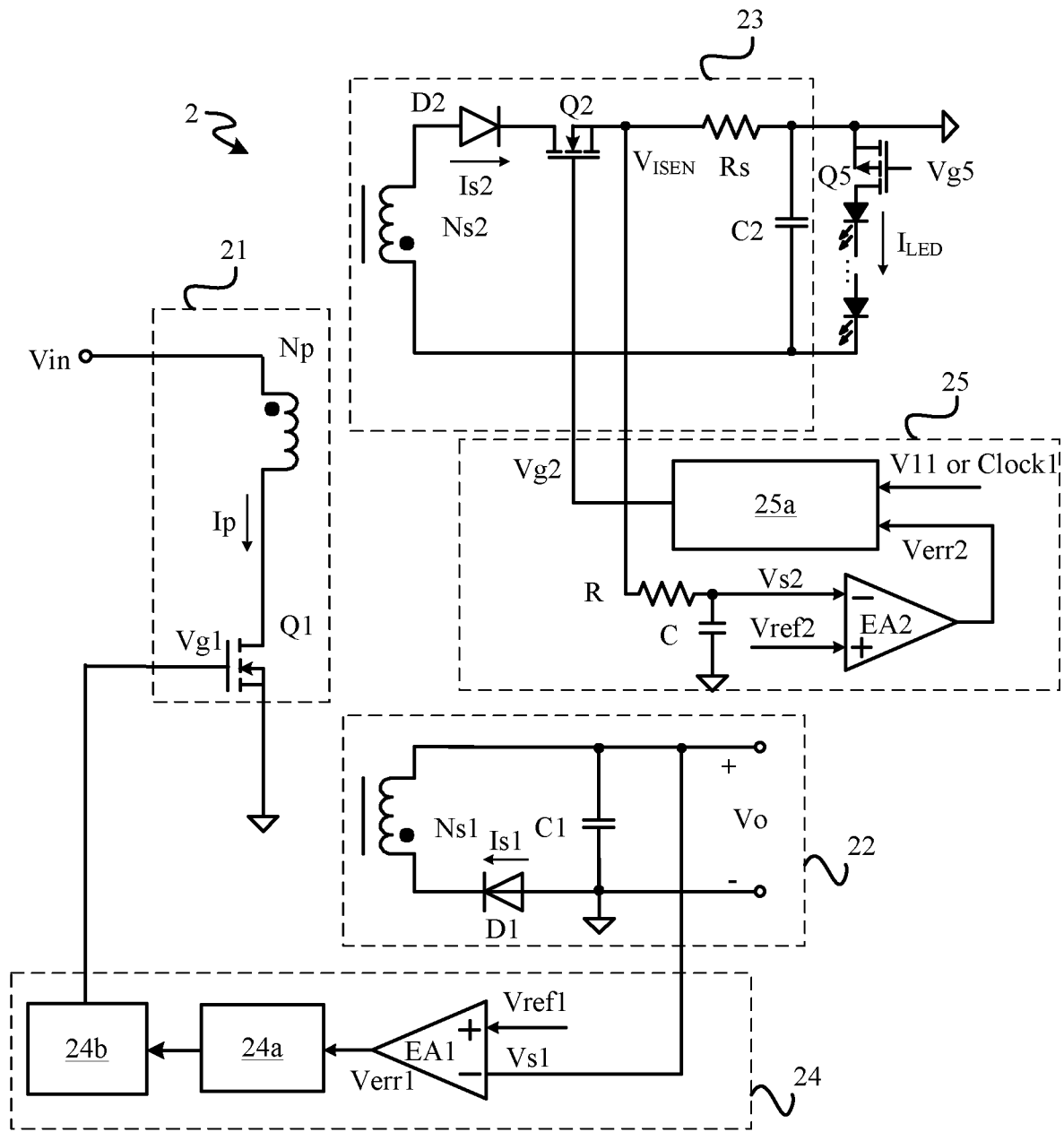
FIG. 2C is a schematic block diagram of a third example power converter, in accordance with embodiments of the present invention.

Referring now to FIG. 2C, shown is a schematic block diagram of a third example power converter, in accordance with embodiments of the present invention. In this particular example, power switch Q5 can be coupled between the anode of the LED load and the ground. Further, power switch Q5 may be controlled by dimming signal Vg5, in order to adjust the current flowing through the LED load. Alternatively, power switch Q5 can connect to the cathode of the LED load.

Figure 3:
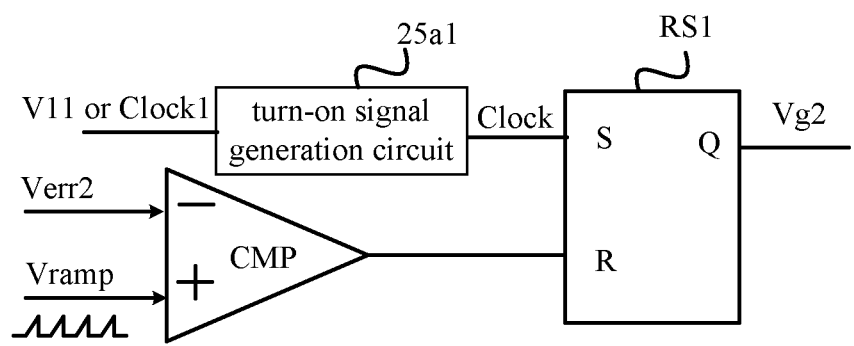
FIG. 3 is a schematic block diagram of an example second control signal generation circuit of the first example power converter, in accordance with embodiments of the present invention.

Referring now to FIG. 3, shown is a schematic block diagram of an example second control signal generation circuit of the first example power converter in accordance with embodiments of the present invention. In this particular example, control signal generation circuit 25a can include RS flip-flop RS1, turn-on signal generation circuit 25a1, and comparator CMP. Turn-on signal generation circuit 25a1 may receive sampling signal V11 or inner clock signal Clock1, in order to generate turn-on signal Clock. Further, the set terminal of the RS flip-flop may receive turn-on signal Clock. In addition, the input terminals of comparator CMP may receive error compensation signal Verr2 and periodic ramp signal Vramp, and the output terminal of comparator CMP may provide a comparison signal. Further, the reset terminal of the RS flip-flop may receive the comparison signal. Further, the output terminal of the RS flip-flop can generate control signal Vg2 in accordance with the comparison signal and turn-on signal Clock.

When the power converter operates in the first state, the secondary power switch can be turned on before the primary power is turned off in one switching cycle. For example, when the primary power switch is turned on, the secondary power can be turned on at the same time. In particular embodiments, in the first state, the power converter may operate in a normal operation state, such as the continuous conduction mode (CCM) or the discontinuous conduction mode (DCM). After the primary power switch is turned on, the voltage across secondary winding Ns1 and the voltage across secondary winding Ns2 can increase rapidly. Therefore, the turn-on moment of the secondary power switch can be controlled by sampling signal V11 representing the voltage across secondary winding Ns1 or the voltage across secondary winding Ns2.

When sampling signal V11 is not less than threshold Vr1, which represents that the primary power switch is still on, the secondary power switch can be controlled to be turned on at this time. When sampling signal V11 is not greater than threshold Vr1, the turn-on moment of the secondary power switch can be controlled in accordance with inner clock signal Clock1. When sampling signal V11 is not greater than threshold Vr1, the secondary power switch can be controlled to remain off. When the power converter operates in a second state, the load may be very light, such that sampling signal V11 may not reach threshold Vr1. In such a case, the turn-on moment of the secondary power switch can be controlled in accordance with inner clock signal Clock1. Here, in the second state, the power converter may operate in the burst mode.

Figure 4:
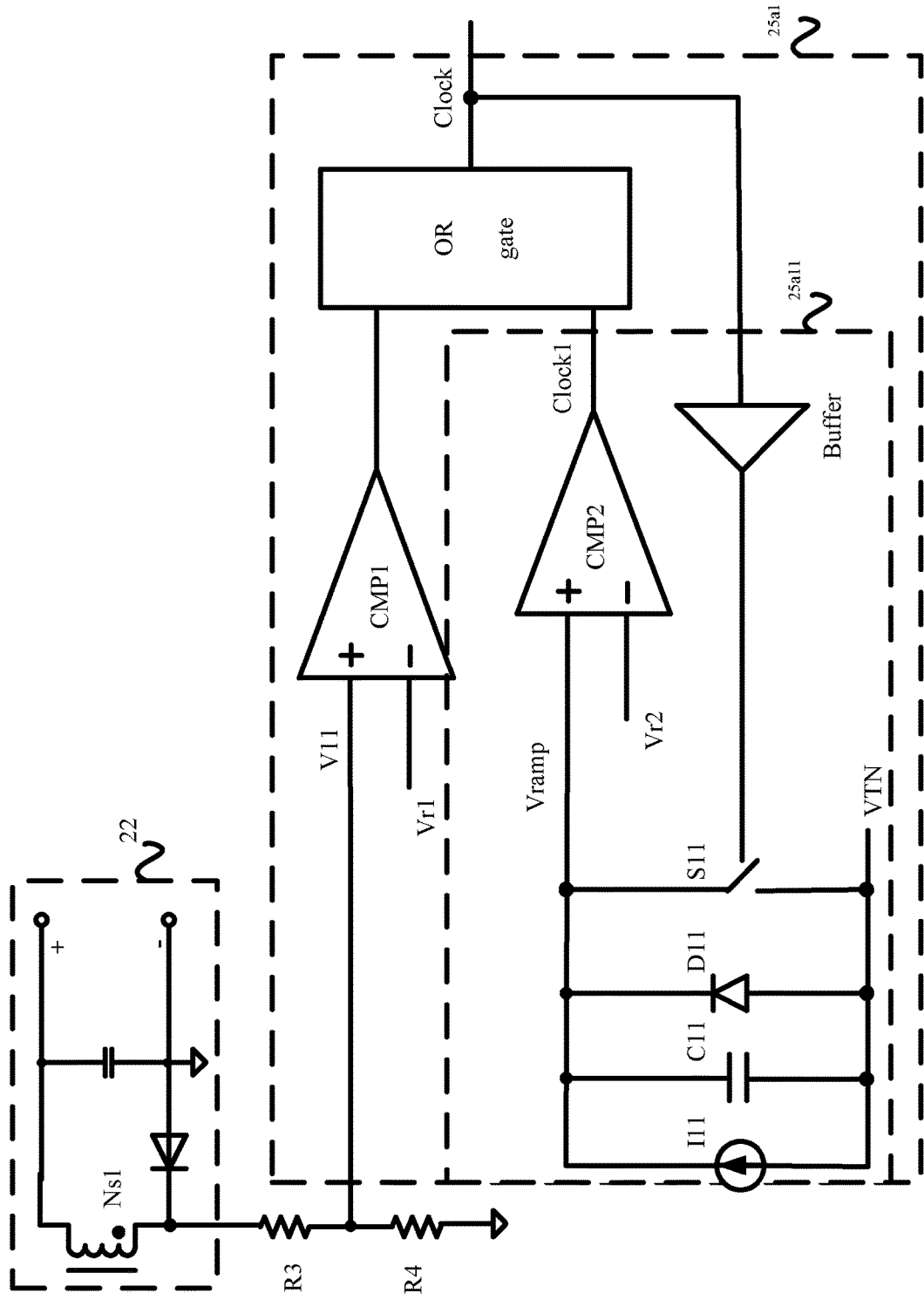
FIG. 4 is a schematic block diagram of an example turn-on signal generation circuit of the first example power converter, in accordance with embodiments of the present invention.

Referring now to FIG. 4, shown is a schematic block diagram of an example turn-on signal generation circuit of the first example power converter in accordance with embodiments of the present invention. In this particular example, turn-on signal generation circuit 25a1 can include comparator CMP1 and inner clock signal generation circuit 25a11. Inner clock signal generation circuit 25a11 can generate inner clock signal Clock1. For example, the first input terminal of comparator CMP1 may receive sampling signal V11 representing the voltage across secondary winding Ns1, the second input terminal of comparator CMP1 may receive threshold Vr1, and the output terminal of comparator CMP1 and the output terminal of inner clock signal generation circuit 25a11 can be coupled to the input terminals of an OR-gate. The output terminal of the OR-gate can output turn-on signal Clock. For example, resistors R3 and R4 can connect in series between one terminal of secondary winding Ns1 and the ground. Sampling signal V11 can be generated at the common terminal of resistors R3 and R4. Sampling signal V11 can be obtained in any suitable fashion in certain embodiments.

For example, inner clock signal generation circuit 25a11 can include capacitor C11, and inner clock signal Clock1 may be generated by charging and discharging capacitor C11. Inner clock signal Clock1 may be activated by charging capacitor C11 when a voltage across capacitor C11 is greater than threshold Vtr2. Inner clock signal Clock1 may be deactivated by discharging capacitor C11 when the voltage across the capacitor C11 is less than threshold Vtr2. For example, threshold Vtr2 is greater than threshold Vtr1.

Inner clock signal generation circuit 25a11 can also include comparator CMP2, current source I11, and switch S11. Capacitor C11, current source I11, and switch S11 can be coupled in parallel. The first input terminal of comparator CMP2 can connect with the first common terminal of capacitor C11, current source I11, and switch S11. The second input terminal of comparator CMP2 may receive threshold Vtr2. The output terminal of comparator CMP2 can connect to an input terminal of the OR-gate, and the output terminal of the OR-gate may be coupled to the control terminal of switch S11 through a buffer that is used to improve the driving ability. Moreover, the second common terminal of capacitor C11, current source I11, and switch S11 can connect with voltage VTN or the ground, and threshold Vtr2 can be greater than voltage VTN.

Inner clock signal generation circuit 25a11 can also include diode D11 that is connected with capacitor C11. The anode of diode D11 can connect with the second common terminal of capacitor C11, current source I11, and switch S11. The cathode of diode D11 can connect with the first common terminal of capacitor C11, current source I11, and switch S11. It should be understood that other circuits realizing the same functionality as inner clock signal generation circuit 25a11 may be utilized in certain embodiments. In addition, ramp signal Vramp shown in FIG. 3 can be generated by inner clock signal generation circuit 25a11. That is, the voltage of the first common terminal of capacitor C11, current source I11, and switch S11 shown in FIG. 4 can be ramp signal Vramp as shown in FIG. 3. Also, ramp signal Vramp can be generated by other circuits.

As shown in FIG. 4, sampling signal V11 represents the voltage across secondary winding Ns1, and in other cases, sampling signal V11 may represent the voltage across secondary winding Ns2. For example, the divided voltage sampled at one end of secondary winding Ns2 in FIG. 2 may be configured as sampling signal V11. Thus, sampling signal V11 can represent the voltage across secondary winding Ns1 or the voltage across secondary winding Ns2. When sampling signal V11 represents different signals, the corresponding threshold V1 may accordingly be different.

Figure 5:
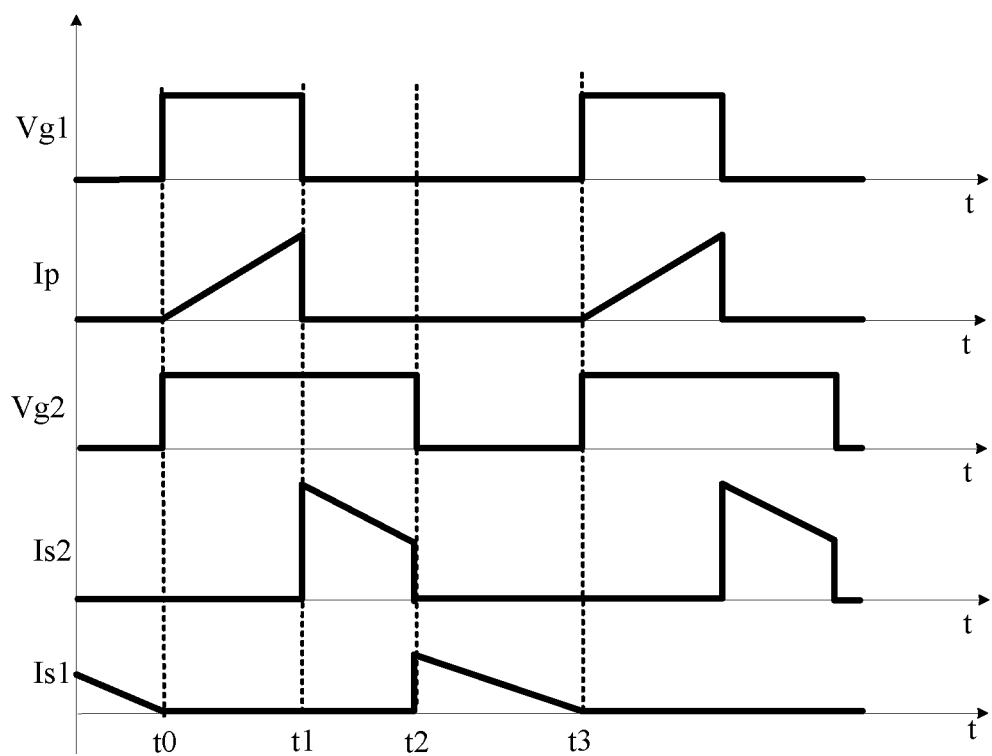
FIG. 5 is a waveform diagram of an example operation of the first example power converter, in accordance with embodiments of the present invention.

Referring now to FIG. 5, shown is a waveform diagram of an example operation of the first example power converter in accordance with embodiments of the present invention. In this example, the power converter operates in the first state. At time t0, control signal Vg1 may switch to a high level, primary power switch Q1 is turned on. During time t0 to time t1, control signal Vg1 may be at a high level, primary power switch Q1 can be maintained as on, and current Ip flowing through primary winding Np may begin to increase from zero. Also, sampling signal V11 representing the voltage across secondary winding Ns1 or the voltage across secondary winding Ns2 can increase. When sampling signal V11 reaches threshold Vtr1, the RS flip-flop in FIG. 3 may be set, control signal Vg2 may transition to a high level, and secondary power switch can be turned on. However, diodes D1 and D2 may be disabled due to reverse bias such that no current flows through the two output circuits. Since the voltage across secondary winding Ns1 and the voltage across secondary winding Ns2 may quickly increase, sampling signal V11 can reach the voltage threshold fast, so it can be considered that primary power switch Q1 and secondary power switch Q2 can be turned on at substantially the same time.

In other examples, secondary power switch Q2 can be turned on before primary power switch Q1 is turned off. For example, secondary power switch Q2 can be turned on at any time during the on time of primary power switch Q1. At time t1, control signal Vg1 may transition to a low level, and primary power switch Q1 can be turned off. During time t1 to time t2, secondary power switch Q2 can be maintained as on. The energy stored in primary winding Ns1 may only be released to output circuit 23. Therefore, current Is2 flowing through secondary winding Ns2 can decrease from the peak value, while current Is1 flowing through secondary winding Ns1 may approach or equal to zero.

At time t2, ramp signal Vramp may reach compensation signal Verr2. Then, the RS flip-flop in FIG. 3 can be reset and control signal Vg2 may transition to a low level, and secondary power switch Q2 can be turned off. During time t2 to time t3, control signal Vg1 can be maintained at a low level and primary power switch Q1 maintained as off. In addition, control signal Vg2 may be maintained at a low level and secondary power switch Q2 as off. Since secondary power switch Q2 is turned off, a freewheeling current may only flow through output circuit 22. Thus, current Is2 can approach or equal to zero, and current Is1 flowing through secondary winding Ns1 may decrease from the peak value, thereby providing energy to the output voltage port.

At time t3, control signal Vg1 may transition to a low level, and primary power switch Q1 can be turned on, which represents the beginning of a new switching cycle. Then, the process mentioned above is repeated. The output voltage of output circuit 22 (e.g., a constant voltage output circuit) can be maintained near the desired output voltage by control circuit 24, and the output current of output circuit 23 (e.g., a constant current output circuit) can be maintained near the desired output current by control circuit 25. In particular embodiments, the primary winding may release the stored energy for the second output circuit initially after the primary power switch is turned off. Also, the primary winding can release the stored energy for the first output circuit initially by controlling the secondary power switch to be turned off after the primary power switch is turned off.

A secondary power switch can connect in series in the second output circuit, and the first secondary winding and the second secondary winding may be determined to make a reflecting voltage from an output voltage of the second secondary winding to the first secondary winding be less than an output voltage of the first secondary winding. Therefore, when the primary power is turned off and the secondary power switch is turned on, the freewheeling current may only flow through the secondary winding of the second output circuit, and when the secondary power switch is turned off, the freewheeling current may flow through the secondary winding of the other output circuits. By controlling the on and off states of secondary power switch Q2, the freewheeling current may flow through output circuit 22 and output circuit 23 in a time sharing manner in each switching cycle, thereby providing multiple constant current/voltage outputs with one power conversion, which may improve the operation efficiency. Moreover, one magnetic component may be utilized, thereby decreasing the size of the system. In addition, secondary power switch Q2 can be turned on before primary power switch Q1 is turned off in the first state in one switching cycle, in order to reduce the switching interference. Also, the power converter can operate in the CCM, BCM, DCM, and burst mode, etc.

It should be understood that although the embodiment has been described with one the first output circuit (e.g., constant voltage output circuit) as examples, the first output circuit may be more than one in some cases. The first control circuit may control the primary power switch in accordance with an output voltage of one of the first output circuits, or an overall output voltage of the first output circuits. Further, although one second output circuit (e.g., constant current output circuit as examples) is described herein, the second output circuit in the power converter may be more than one. Each second output circuit may have substantially the same structure. Moreover, the second control circuit can include a plurality of sub-control circuits that control secondary power switches in the second output circuits respectively. Thus, freewheeling currents may flow simultaneously or in a time sharing manner through a plurality of the second output circuits when the primary power switch is turned off, in order to output a constant current.

Figure 6:
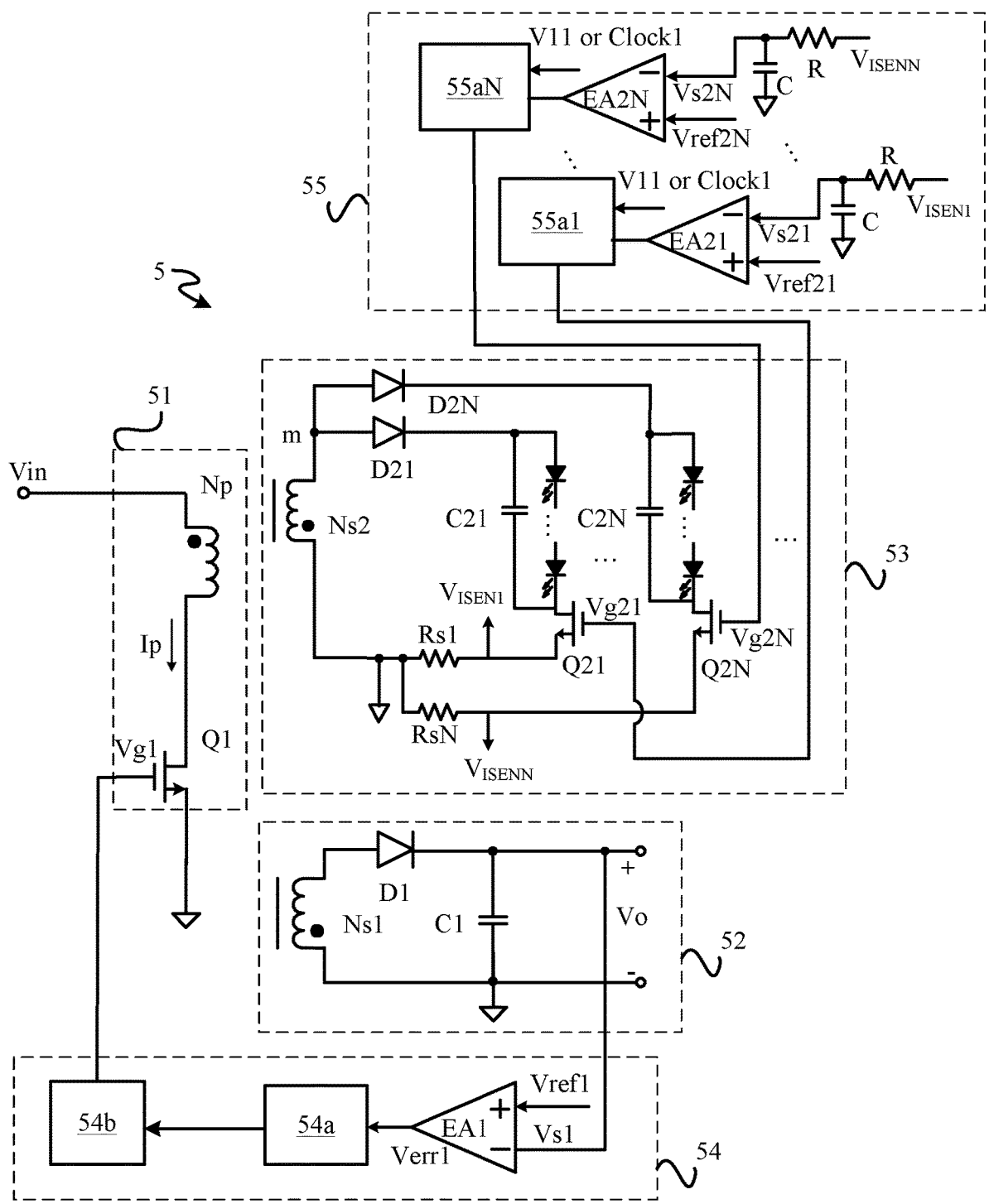
FIG. 6 is a schematic block diagram of a fourth example power converter, in accordance with embodiments of the present invention.

Referring now to FIG. 6, shown is a schematic block diagram of a fourth example power converter in accordance with embodiments of the present invention. In this particular example, power converter 5 can include input circuit 51, at least one output circuit 52, at least one output circuit 53, control circuit 54, and control circuit 55. Output circuit 53 can include secondary winding Ns2 and at least two output branches. Further, output circuit 52 and output circuit 53 may control a reflecting voltage from the output voltage of secondary winding Ns2 to secondary winding Ns1 that is less than an output voltage of secondary winding Ns1. Each of the two output branches can include a current output port, a second rectifier circuit coupled between the current output port and the input terminal "m" of the output branch, and current sampling circuit Rsi and secondary power switch Q2$i$ (e.g., i=1~N, N is an integer and greater than or equal to 2) can connect in series with each other in the output branch. All of the output braches can connect in parallel between two ends of secondary winding Ns2. That is, all of the output branches may have a common secondary winding Ns2. When any number of second secondary power switches Q2$i$ are turned on, a freewheeling current generated in the secondary winding Ns2 can flow through the corresponding output branches to drive the corresponding LED load. By controlling the on time of secondary power switch Q2$i$, the brightness of the LED load in different output branch may be different.

For example, current sampling circuit Rsi is a sampling resistor connected between the ground (e.g., a dotted terminal of secondary winding Ns2) and a first terminal of secondary power switch Q2$i$. Also, the second terminal of secondary power switch Q2$i$ can connect to a second terminal of the corresponding current output port. Further, the LED load can connect to the corresponding current output port. The second rectifier circuit can include diode D2$i$ and capacitor C2$i$. In any case, secondary power switch Q2$i$ and current sampling circuit Rsi can be connected in series in the output branch.

For example, control circuit 55 can include a plurality of sub-control circuits. Each sub-control circuit can average current sampling signal $V_{ISENi}$ obtained by sampling current sampling circuit Rsi in the corresponding output branch to obtain average sampling signal Vs2$i$ representing an average current driving the LED load in the corresponding output branch, further generates control signal Vg2$i$ in accordance with average sampling signal Vs2$i$, current reference signal Vref2$i$ representing a desired output current of the corresponding output branch, and sampling signal V11 or inner clock signal Clock1. Sampling signal V11 may represent the voltage across secondary winding Ns1 or secondary winding Ns2. Further, control signal Vg2$i$ can control the on and off states of secondary power switch Q2$i$ in the corresponding output branch to maintain the output current of the corresponding output branch constant. In addition, the freewheeling current can flow through different output branches simultaneously or in a time sharing manner.

Optionally, each sub-control circuit can include an average circuit, error amplifier circuit EA2$i$, and control signal generation circuit 55$ai$. For example, the averaging circuit is an RC circuit including a resistor and a capacitor. For example, control signal generation circuit 55$ai$ may be the same as that discussed above with reference to FIGS. 3 and 4. Further, when performing LED load dimming, the desired output current can be adjusted by adjusting current reference signal Vref2$i$ according to the dimming signal to realize the adjustment of the output current. In other examples, the LED load dimming can be realized in other ways. In particular embodiments, the output current of each output branch can be independently controlled. In another embodiments, when all of the loads are the same, all of secondary power switches Q2*i* can be controlled in accordance with an output current of one output branch, such that the control circuit can be simplified.

For example, the second output circuit (e.g., a constant current output circuit) can include a plurality of output branches having a common second secondary winding. In this way, while realizing multiple constant current output, the number of magnetic components can be decreased, and the volume of multiple constant current output circuit may be reduced. It should be understood that that the number of the first output circuit (e.g., the constant voltage output circuit) may be greater than one. Moreover, control circuit 54 can control the primary power switch in accordance with an output voltage of one of first output circuits, or a total output voltage of the first output circuits. It also should be understood that the number of the second output circuit (e.g., a constant current output circuit) may be greater than one. Each second output circuit can be the same as each other. Moreover, the second control circuit can include a plurality of sub-control circuits to control the corresponding secondary power switches in the second output circuits respectively. Thus, freewheeling currents may flow simultaneously or in a time sharing manner through the second output circuits when the primary power switch is turned off, in order to maintain the output current constant.

Figure 7A:
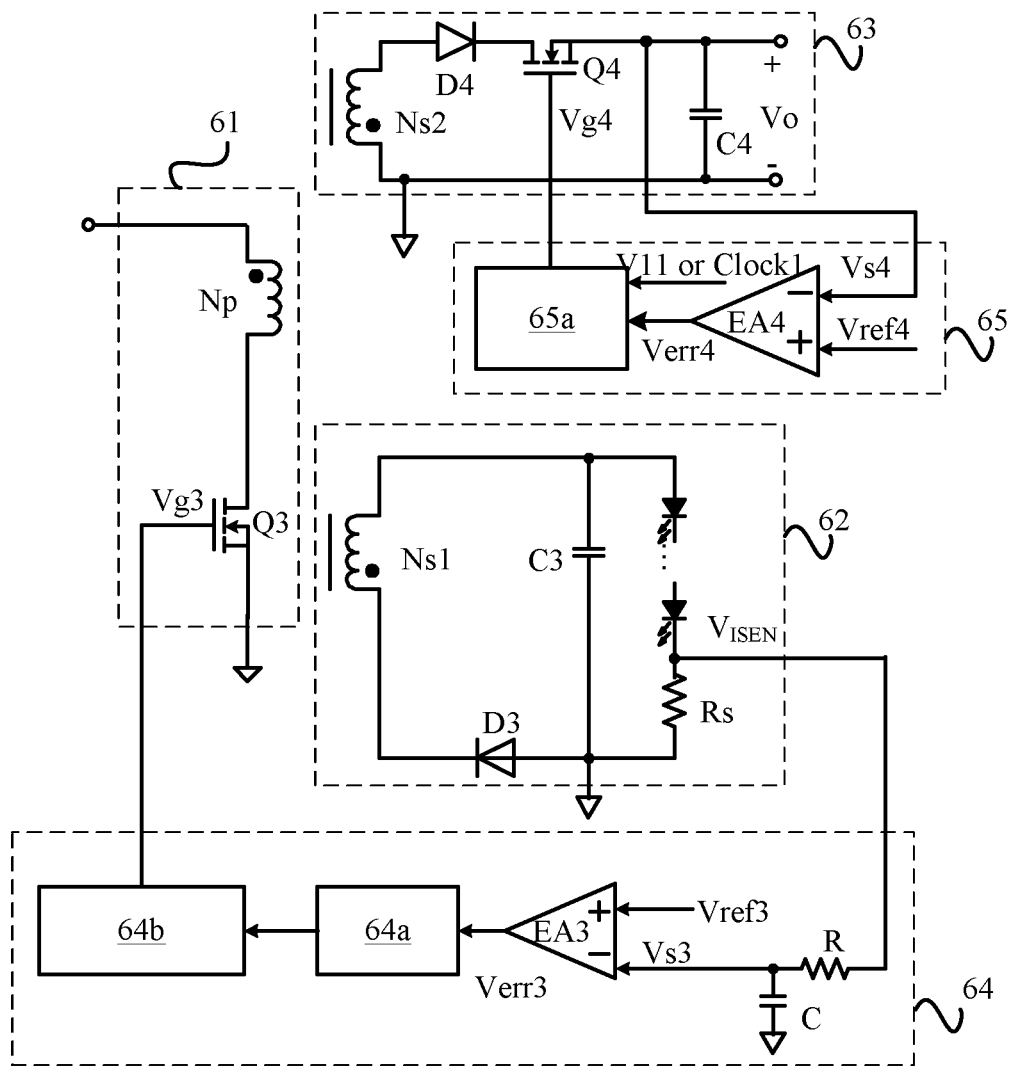
FIG. 7A is a schematic block diagram of a fifth example power converter, in accordance with embodiments of the present invention.
Figure 7B:
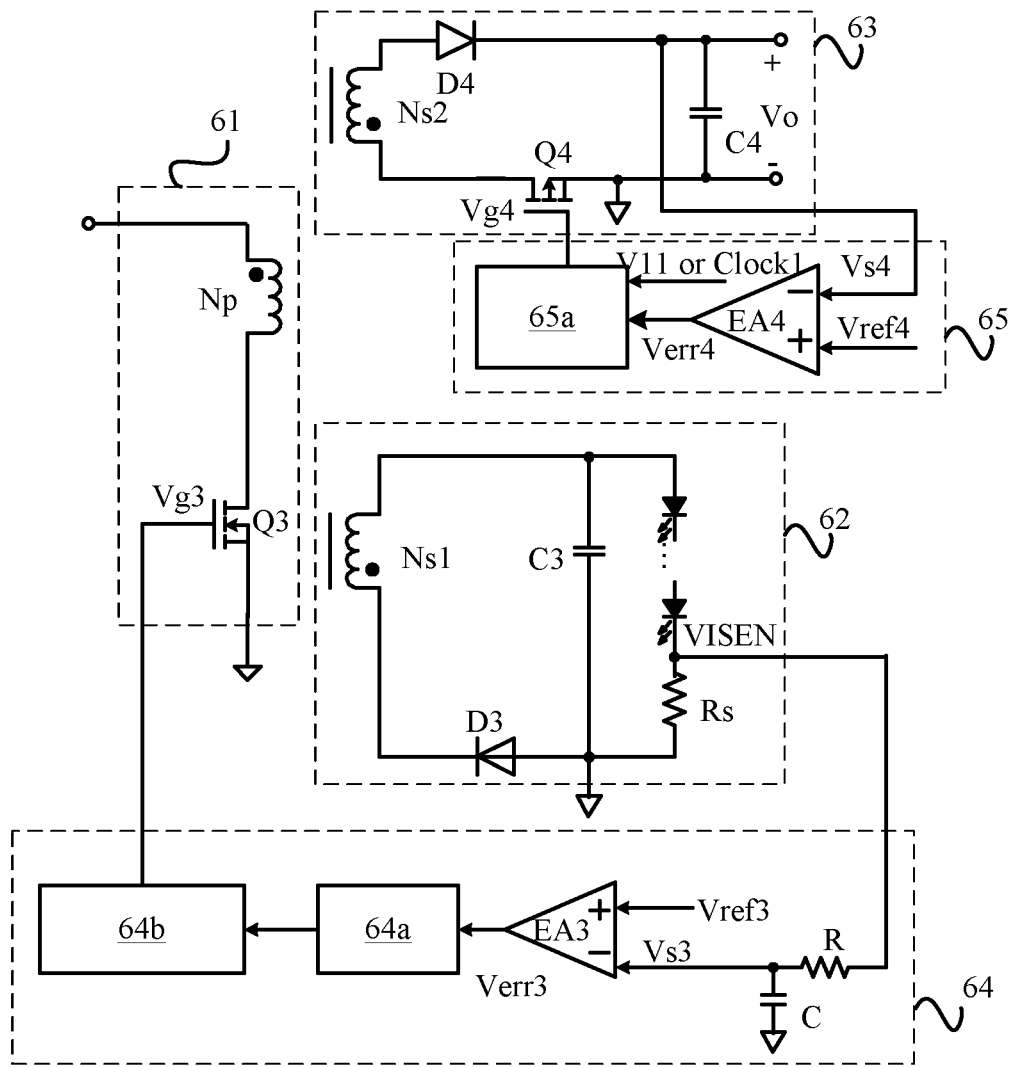
FIG. 7B is a schematic block diagram of a sixth example power converter, in accordance with embodiments of the present invention.

Referring now to FIGS. 7A and 7B, shown are schematic block diagrams of fifth and sixth example power converters, in accordance with embodiments of the present invention. For example, power converter 6 can include input circuit 61, output circuit 62, at least one output circuit 63, control circuit 64, and control circuit 65. Input circuit 61 may be the same as that discussed above. For example, output circuit 62 is a constant current output circuit, and output circuit 63 is a constant voltage output circuit. In particular embodiments, output circuit 62 can include secondary winding Ns1, a current output port, a first rectifier circuit, and current sampling circuit Rs. The first rectifier circuit can connect between secondary winding Ns1 and the current output port. For example, the first rectifier circuit can include diode D3 connected between secondary winding Ns1 and one terminal of the current output port, and capacitor C3 connected at the current output port. The current output port can connect with the load (e.g., LED load) of the constant current circuit. For example, current sampling circuit Rs is a sampling resistor connected between the ground and one terminal of the current output port. Thus, current sampling signal $V_{ISEN}$ representing the output current can be obtained directly by sampling the voltage at one terminal of the sampling circuit without additional circuits. The current sampling circuit can also connect in series with the current output port, or with the secondary winding Ns1.

Control circuit 64 can average current sampling signal $V_{ISEN}$ obtained by sampling the voltage of current sampling circuit Rs. Then, average sampling signal Vs3 representing an average current for driving the LED load may be obtained. Further, control signal Vg3 may be generated in accordance with average sampling signal Vs3 and current reference signal Vref3 representing a desired output current. Further, control signal Vg3 can control the on/off states of primary power switch Q3 to maintain the output current of output circuit 62 as constant. Further, when performing LED load dimming, the desired output current can be adjusted by adjusting current reference signal Vref3 according to the dimming signal, in order to realize the adjustment of the output current. Optionally, a power switch can be coupled between the anode of the LED load and the ground can be provided, such as Q5 shown in FIG. 2C). Further, the power switch (e.g., Q5) may be controlled by current adjustment signal (e.g., the dimming signal Vg5), in order to adjust the current flowing through the LED load. Alternatively, a power switch (e.g., Q5) may instead connect to the cathode of the LED load.

Control circuit 64 can include an averaging circuit, error amplifier circuit EA3, optocoupler circuit 64a, and control signal generation circuit 64b. The averaging circuit can average current sampling signal $V_{ISEN}$ to generate average sampling signal Vs3. For example, the averaging circuit is an RC circuit including a resistor and a capacitor. Error amplifier circuit EA3 may generate error compensation signal Verr3 in accordance with average sampling signal Vs3 and current reference signal Vref3. Optocoupler circuit 64a can transfer error compensation signal Verr3 from the secondary side to the primary side (e.g., control signal generation circuit 64b) in an optocoupler manner. Control signal generation circuit 64b may generate control signal Vg3 in accordance with error compensation signal Verr3 for controlling the on and off states of primary power switch Q3. It should be understood that control circuit 64 mentioned above is shown only as an example, and other circuits realizing the same functionality may be applicable in certain embodiments.

Output circuit 63 can include secondary winding Ns2, a voltage output port, secondary power switch Q4, and diode D4 and capacitor C4 for rectifying and filtering. Diode D4 and secondary power switch Q4 can connect in series between the voltage output port and secondary winding Ns2. Capacitor C4 can connect at the voltage output port. Secondary power switch Q4 may be controlled to be turned on and off to maintain the output voltage of the voltage output port constant. For example, secondary power switch Q4 can be coupled between the high potential terminal of the voltage output port and secondary winding Ns2. In other examples, secondary power switch Q4 can instead be coupled between the low potential terminal of the voltage output port and secondary winding Ns2, as shown in FIG. 7B.

Control circuit 65 may obtain voltage sampling signal Vs4 by sampling output voltage Vo. Further, error compensation signal Verr4 can be obtained according to voltage reference signal Vref4 representing a desired output voltage and voltage sampling signal Vs4. Further, control signal Vg4 may be generated according to error compensation signal Verr4 and sampling signal V11 or inner clock signal Clock1, to control secondary power switch Q4 to be turned on and turned off. For example, sampling signal V11 may represent the voltage across secondary winding Ns1 or secondary winding Ns2.

For example, control circuit 65 can control the turn-off moment of the secondary power switch according to error compensation signal Verr4 that is generated according to voltage sampling signal Vs4 and voltage reference signal Vref4, and may control the turn-on moment of the secondary power switch according to sampling signal V11 or inner clock signal Clock1. For example, control circuit 65 can include error amplifier circuit EA4 and control signal generation circuit 65a. Error amplifier circuit EA4 may generate error compensation signal Verr4 in accordance with voltage reference signal Vref4 representing a desired output voltage and voltage sampling signal Vs4. Control signal generation circuit 65a can generate control signal Vg4 according to error compensation signal Verr4 and sampling signal V11 or inner clock signal Clock1, in order to control the on and off states of secondary power switch Q4.

For example, control signal generation circuit 65a is the same as that shown in FIGS. 3 and 4. In such a case, by controlling the on and off states of secondary power switch Q4, a time of period during which the freewheeling current flows through the second output circuit in each switching cycle may be adjusted thereby controlling energy provided to the second output circuit. Thus, the output voltage can be maintained as constant. For example, the second output circuit is a constant voltage output circuit. A plurality of constant voltage outputs and a single constant current output using only one magnetic component (e.g., a transformer) may be provided, and thus the system efficiency may be increased and the volume of the system reduced.

It also should be understood that the number of the second output circuit (e.g., a constant voltage output circuit) is not limited to one. Each second output circuit may be the same as each other. Optionally, the second output circuit (e.g., a constant voltage output circuit) can include a plurality of output branches having a common second secondary winding. In such way, while realizing multiple constant voltage output, the number of magnetic components may not be increased, and the volume of the constant voltage output circuit reduced. Moreover, the second control circuit can include a plurality of sub-control circuits to control the corresponding secondary power switches in the second output circuits respectively so that freewheeling currents flow simultaneously or in a time sharing manner through the second output circuits when the primary power switch is turned off, in order to output a constant voltage.

Figure 8:
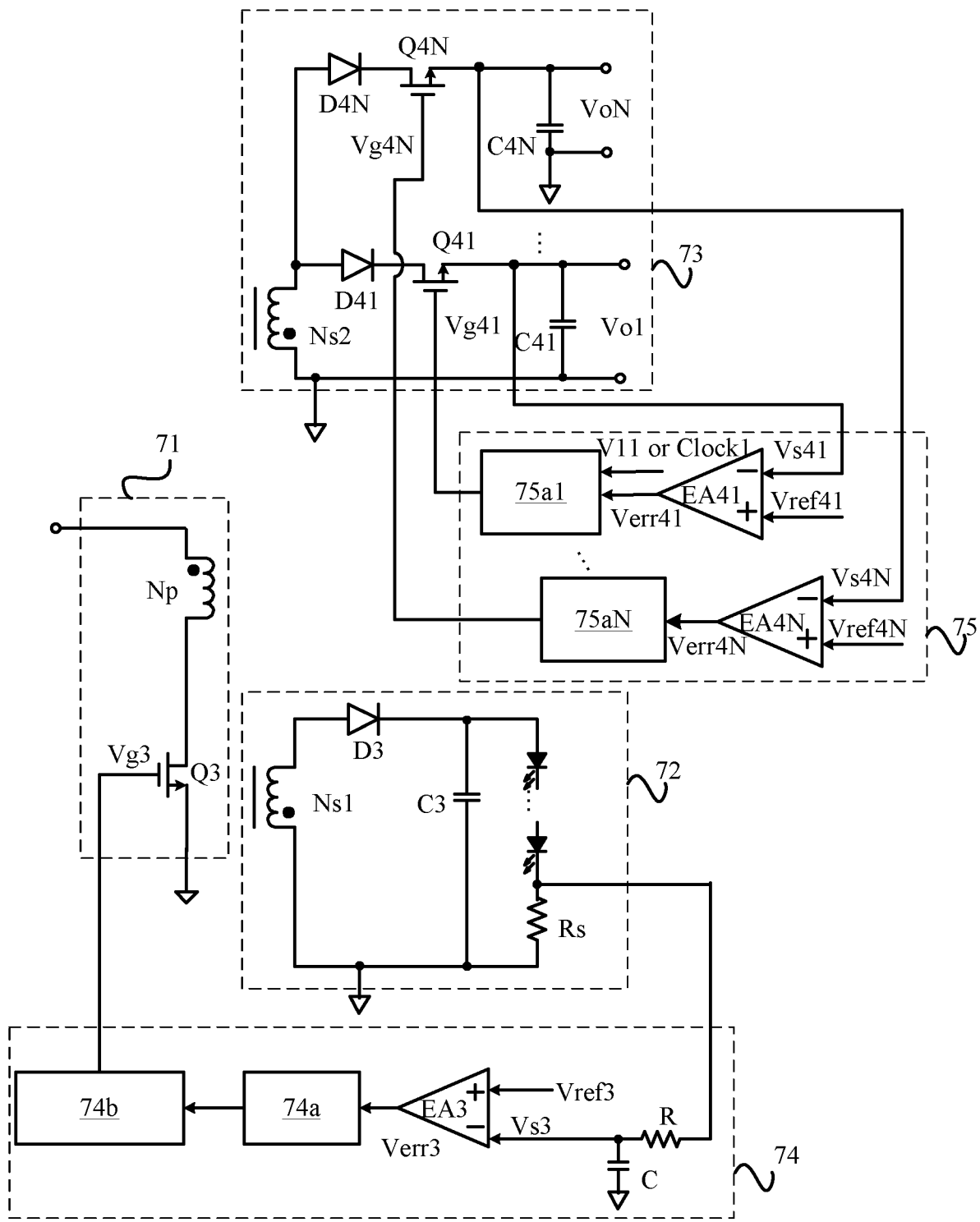
FIG. 8 is a schematic block diagram of a seventh example power converter, in accordance with embodiments of the present invention.

Referring now to FIG. 8, shown is a schematic block diagram of a seventh example power converter in accordance with embodiments of the present invention. In this particular example, power converter 7 can include input circuit 71, output circuit 72, at least one output circuit 73, and control circuits 74 and 75. Output circuit 73 may be a constant voltage output circuit, and can include secondary winding Ns2 and at least two output branches connected in parallel between the two ends of secondary winding Ns2. For example, each of the output branches can include a voltage output port, diode D4i and secondary power switch Q4i (e.g., i=1~N, N is an integer larger than or equal to 2) connected in series between the output port and the input terminal of the output branch, and capacitor C4i connected at the voltage output port of the output branch.

When secondary power switches Q4i is turned on, a freewheeling current may be generated in the secondary winding Ns2 and flow through the corresponding output branch to drive the corresponding LED load. By controlling the on time of secondary power switch Q4i of the corresponding output branch, different output branches can output different constant voltages. For example, control circuit 75 can include a plurality of sub-control circuit. Each sub-control circuit may generate control signal Vg4i in accordance with voltage sampling signal Vs4i, voltage reference signal Vref4i representing a desired output voltage of the corresponding output branch, and sampling signal V11 or inner clock signal Clock1. Further, control signal Vg4i can control the on and off states of secondary power switch Q4i in the corresponding output branch, in order to maintain the output voltage of the corresponding output branch as constant. For example, sampling signal V11 represents the voltage across secondary winding Ns1 or secondary winding Ns2.

Optionally, each sub-control circuit can include error amplifier circuit EA4i, and control signal generation circuit 75ai. For example, control signal generation circuit 75ai is the same as that discussed above with reference to FIG. 3 and other control circuits that realize the same functionality may also be utilized in certain embodiments. In particular embodiments, the output current of each output branch can be independently controlled. Certain embodiments, when all of the loads are the same, all of secondary power switches Q4i can be controlled in accordance with an output voltage of one output branch. Thus, the control circuit can be simplified. For example, the second output circuit (e.g., a constant voltage output circuit) includes a plurality of output branches having a common second secondary winding. In this way, multiple constant voltage outputs are provided, the number of magnetic components can be decreased, and the volume of the constant voltage output circuit can be reduced.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:
1. A power converter, comprising:
 a) an input circuit having a primary winding and a primary power switch that are coupled in series between an input terminal of the power converter and a ground;
 b) a first output circuit having a first secondary winding coupled with the primary winding;
 c) a second output circuit having a second secondary winding coupled with the primary winding and a secondary power switch;
 d) a first control circuit configured to control the primary power switch to be turned on and off to adjust an output signal of the first output circuit;
 e) a second control circuit configured to control the secondary power switch to be turned on and off to adjust an output signal of the second output circuit;
 f) wherein the secondary power switch is configured to be turned on before the primary power switch is turned off in a first state in one switching cycle; and
 g) wherein the first secondary winding and the second secondary winding are determined to make a reflecting voltage from an output voltage of the second secondary winding to the first secondary winding be less than an output voltage of the first secondary winding such that the first output circuit is blocked when the secondary power switch is turned on.

2. The power converter of claim 1, wherein the second output circuit is a constant current output circuit comprising:
 a) a current output port;
 b) a second rectifier circuit coupled between the current output port and the second secondary winding;
 c) a current sampling circuit coupled in series with the second secondary winding; and
 d) wherein the secondary power switch is coupled in series with the second secondary winding, and is controlled to be turned on and off to maintain an output current of the current output port as constant.

3. The power converter of claim 2, wherein:
 a) the second control circuit is configured to control the on and off states of the secondary power switch according to a current sampling signal, a current reference signal, a first sampling signal or an inner clock signal to maintain the output current of the second output circuit constant; and
 b) the current sampling signal representing the output current is obtained by the current sampling circuit, the current reference signal represents a desired output current of the second output circuit, and the first sampling signal represents a voltage across the first secondary winding or the second secondary winding.

4. The power converter of claim 3, wherein the second control circuit is configured to control the turn-off moment of the secondary power switch according to the current sampling signal and the current reference signal.

5. The power converter of claim 3, wherein the current reference signal is configured to be adjusted by a current adjustment signal or a dimming signal.

6. The power converter of claim 2, wherein the second output circuit further comprises a fifth power switch coupled to the current output port and having a control terminal to receive a current adjustment signal or a dimming signal to adjust the output current of the second output circuit.

7. The power converter of claim 1, wherein the second output circuit is configured as a constant voltage output circuit comprising:
a) a voltage output port;
b) a rectifier diode coupled in series with the secondary power switch between the voltage output port and the second secondary winding;
c) a filtering capacitor, coupled to the voltage output port; and
d) wherein the secondary power switch is controlled to be turned on and off to maintain an output voltage of the voltage output port constant.

8. The power converter of claim 7, wherein:
a) the second control circuit is configured to control the on and off states of the secondary power switch according to a voltage sampling signal, a voltage reference signal, a first sampling signal or an inner clock signal to maintain the output voltage of the second output circuit constant; and
b) the voltage sampling signal represents an output voltage of the second output circuit and the voltage reference signal represents a desired output voltage of the second output circuit, and the first sampling signal represents a voltage across the first secondary winding or the second secondary winding.

9. The power converter of claim 8, wherein the second control circuit is configured to control the turn-off moment of the secondary power switch according to the voltage sampling signal and the voltage reference signal.

10. The power converter of claim 1, wherein the secondary power switch is turned on when the primary power switch is turned on in the first state.

11. The power converter of claim 1, wherein the second control circuit is configured to control the secondary power switch to be turned on during the on time of the primary power switch in the first state.

12. The power converter of claim 1, wherein the primary power switch and the secondary power switch have the same switching cycle, and the second control circuit is configured to control the secondary power switch to be turned on for at least a portion of time period during which the primary power switch is turned off in the first state, such that the output signal of the second output circuit is maintained as constant.

13. The power converter of claim 1, wherein the second control circuit is configured to control a turn-on moment according to an inner clock signal generated by an inner clock signal generation circuit in a second state.

14. The power converter of claim 13, wherein the inner clock signal generation circuit includes a first capacitor, and the inner clock signal is generated by charging and discharging the first capacitor.

15. The power converter of claim 14, wherein:
a) when the first capacitor is controlled to be charged, the inner clock signal is converted to be active when a voltage across the first capacitor is greater than a second threshold; and
b) when the first capacitor is controlled to be discharged, the inner clock signal is converted to be inactive when the voltage across the first capacitor is less than the second threshold.

16. The power converter of claim 1, wherein the first output circuit is a constant voltage output circuit comprising:
a) a voltage output port;
b) a first rectifier circuit coupled between the output voltage port and the first secondary winding; and
c) wherein the primary power switch is controlled to be turned on and off to maintain an output voltage of the first output circuit constant.

17. The power converter of claim 1, wherein the first output circuit is a constant current output circuit comprising:
a) a current output port;
b) a first rectifier circuit, coupled between the current output port and the first secondary winding;
c) a current sampling circuit, coupled in series with the first second winding; and
d) wherein the primary power switch is controlled to be turned on and off to maintain an output current of the first output circuit constant.

18. A power converter, comprising:
a) an input circuit having a primary winding and a primary power switch that are coupled in series between an input terminal of the power converter and a ground;
b) a first output circuit having a first secondary winding coupled with the primary winding;
c) a second output circuit having a second secondary winding coupled with the primary winding and a secondary power switch;
d) a first control circuit configured to control the primary power switch to be turned on and off to adjust an output signal of the first output circuit;
e) a second control circuit configured to control the secondary power switch to be turned on and off to adjust an output signal of the second output circuit;
f) wherein the secondary power switch is configured to be turned on before the primary power switch is turned off in a first state in one switching cycle; and
g) wherein the second control circuit is configured to control a turn-on moment according to a first sampling signal representing a voltage across the first secondary winding or the second secondary winding in the first state.

19. The power converter of claim 18, wherein after the primary power switch is turned on, the secondary power switch is controlled to be turned on when the first sampling signal is not less than a first threshold.

* * * * *